(12) United States Patent
Liu

(10) Patent No.: US 11,121,053 B2
(45) Date of Patent: Sep. 14, 2021

(54) DIE HEAT DISSIPATION STRUCTURE

(71) Applicant: ASIA VITAL COMPONENTS (CHINA) CO., LTD., Shenzhen (CN)

(72) Inventor: Han-Min Liu, Shenzhen (CN)

(73) Assignee: Asia Vital Components (China) Co., Ltd., Shenzhen (CN)

(*) Notice: Subject to any disclaimer, the term of this patent is extended or adjusted under 35 U.S.C. 154(b) by 0 days.

(21) Appl. No.: 16/745,353

(22) Filed: Jan. 17, 2020

(65) Prior Publication Data
US 2021/0225725 A1   Jul. 22, 2021

(51) Int. Cl.
*H05K 7/20* (2006.01)
*H01L 23/367* (2006.01)
*H01L 21/304* (2006.01)

(52) U.S. Cl.
CPC ........ *H01L 23/3672* (2013.01); *H01L 21/304* (2013.01); *H05K 7/2039* (2013.01)

(58) Field of Classification Search
None
See application file for complete search history.

(56) References Cited

U.S. PATENT DOCUMENTS

| | | | |
|---|---|---|---|
| 6,255,724 B1 * | 7/2001 | Ambrosy | G02B 6/423 257/432 |
| 7,773,382 B2 * | 8/2010 | Kingston | H01L 25/117 361/719 |
| 8,373,990 B2 * | 2/2013 | Jarmany | H05K 7/20445 361/707 |
| 8,797,742 B2 * | 8/2014 | Kawai | H05K 7/20409 361/707 |
| 9,277,681 B2 * | 3/2016 | Kawai | H05K 5/0082 |
| 9,736,966 B1 * | 8/2017 | Anderl | H01L 21/4882 |
| 10,186,470 B2 * | 1/2019 | Abeyasekera | H01L 23/34 |
| 2004/0207985 A1 * | 10/2004 | Delano | H01L 23/4338 361/704 |
| 2005/0078456 A1 * | 4/2005 | Mandel | H01L 23/3675 361/719 |
| 2008/0073775 A1 * | 3/2008 | Brunschwiler | H01L 23/433 257/704 |
| 2015/0290692 A1 * | 10/2015 | Hirata | B21D 13/02 72/379.6 |
| 2019/0378810 A1 | 12/2019 | Yoshioka et al. | |
| 2020/0031022 A1 * | 1/2020 | Kitayama | B29C 33/02 |

FOREIGN PATENT DOCUMENTS

TW   M244581 U   9/2004
TW   200612810 U   4/2006

* cited by examiner

*Primary Examiner* — Courtney L Smith
(74) *Attorney, Agent, or Firm* — Thomas J. Nikolai; DeWitt LLP

(57) ABSTRACT

A die heat dissipation structure includes a heat dissipation unit and a die. The heat dissipation unit has a first side and a second side. The second side is formed with a contact section raised from the second side. One end of the contact section has a slightly convex form. The die has an upper surface and a lower surface. One end of the contact section attaches to and is in contact with the upper surface of the die. The upper surface has a slightly concave form in adaptation to the slightly convex form of the contact section.

7 Claims, 2 Drawing Sheets

DIE HEAT DISSIPATION STRUCTURE

BACKGROUND OF THE INVENTION

1. Field of the Invention

The present invention relates generally to a die heat dissipation structure, and more particularly to a die heat dissipation structure, which can greatly reduce thermal resistance problem and greatly enhance heat dissipation performance.

2. Description of the Related Art

The semiconductor integrated circuit industry has rapidly advanced. The technical advance of the material and design of the semiconductor integrated circuit has produced many generations of semiconductor integrated circuits. Each generation of semiconductor integrated circuit has smaller and more complicated circuits than the previous generation of semiconductor integrated circuit. However, the advance of the semiconductor integrated circuit has increased the complexity in processing and manufacturing the semiconductor integrated circuit.

The conventional chip includes a die and a packaging case. In general, the die and the packaging case are connected by means of indium welding or other connection means. However, such structural design has been found to significantly increase the thermal resistance between the die and the packaging case interface. Therefore, in the recent years, with the increase of the power and heat flow density, to effectively enhance the heat dissipation performance of the chip, some chip manufacturers have omitted the packaging case component enclosing the chip. Accordingly, the thermal resistance of the packaging case material main body and the thermal resistance of the interface material are reduced. Thus, the design model becomes a structure of a die, thermal grease and a heat sink. However, in such design, the flatness of the die silicon material, the weight of the heat sink and the latching force require higher precision. When the die circuitry works at high temperature, the die tends to deform so that the surface of the die has a slightly concave form. As a result, when the heat sink attaches to and is in contact with the die, a gap exists between the die and the heat sink to still cause a thermal resistance problem. Therefore, the heat of the die can not be quickly dissipated by the heat sink so that the enhancement of the heat dissipation performance is quite limited.

According to the above, the conventional die heat dissipation structure has the following shortcomings:

1. Serious thermal resistance problem.
2. Poorer heat dissipation performance.

The applicant has devised a die heat dissipation structure to solve the above problem existing in conventional die heat dissipation structures.

SUMMARY OF THE INVENTION

It is therefore a primary object of the present invention to provide a die heat dissipation structure, which can greatly reduce thermal resistance problem.

It is a further object of the present invention to provide the above die heat dissipation structure, which can greatly enhance heat dissipation performance.

To achieve the above and other objects, the die heat dissipation structure of the present invention includes a heat dissipation unit and a die. The heat dissipation unit has a first side and a second side. The second side is formed with a contact section projecting out from the second side. (That is, the contact section is formed on a surface of a projecting section of the second side of the heat dissipation unit). The contact section's major surface has a slightly convex form. The die has an upper surface and a lower surface. The contact section's major surface attaches to and is in contact with the die's upper surface which has a slightly concave form in adaptation to the slightly convex form of the contact section.

According to the structural design of the present invention, when the circuitry on the die starts to work, it will generate heat to make the temperature of the die gradually rise. The upper surface of the die will deform at high temperature to have a slightly concave form. The major surface of the contact section of the heat dissipation unit has been provided with a slightly convex form fully in adaptation to the slightly concave form of the upper surface of the die. Therefore, the upper surface of the die can fully contact and attach to the contact section without any gap. Accordingly, the thermal resistance problem is effectively reduced and the heat of the die can be quickly carried away by the heat dissipation unit to greatly enhance the heat dissipation performance.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
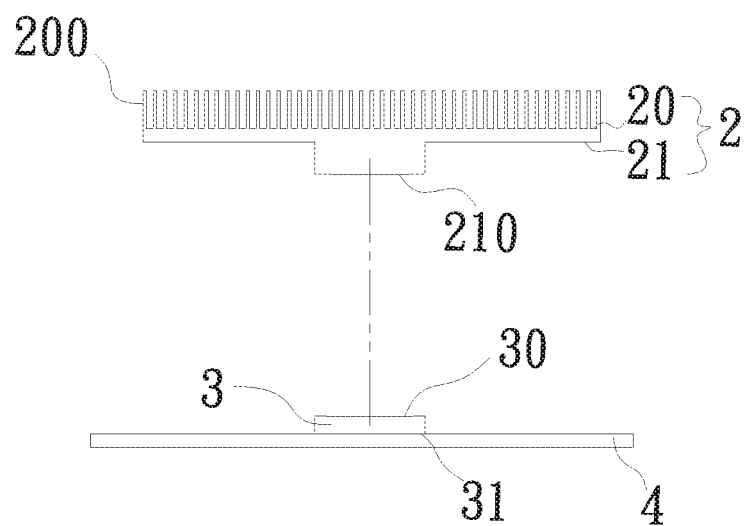
FIG. 1 is an exploded view of the die heat dissipation structure of the present invention.
Figure 2:
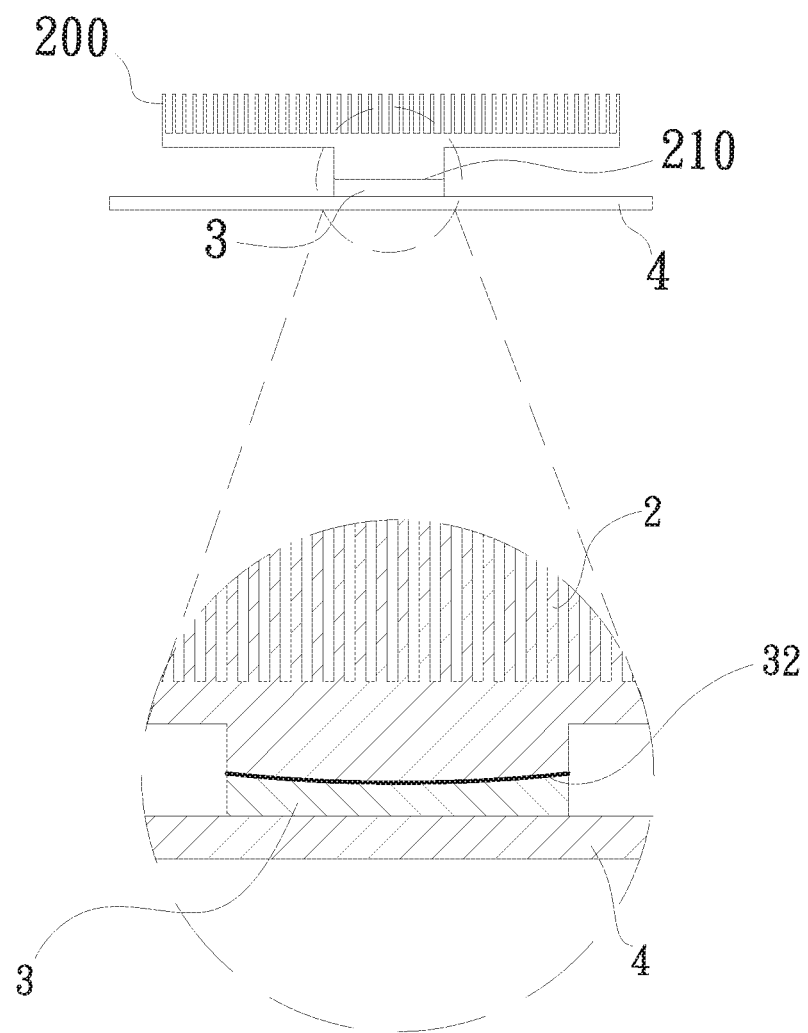
FIG. 2 is an enlarged view of the die heat dissipation structure of the present invention.

Please refer to FIGS. 1 and 2. FIG. 1 is an exploded view of the die heat dissipation structure of the present invention. FIG. 2 is an enlarged view of the die heat dissipation structure of the present invention. As shown in the drawings, the die heat dissipation structure of the present invention includes a heat dissipation unit 2 and a die 3. The heat dissipation unit 2 can be a heat sink, a heat dissipation base seat, a vapor chamber or any other heat dissipation component browsing the art. The heat dissipation unit 2 has a first side 20 and a second side 21. Multiple radiating fins 200 are formed on the first side 20. The second side 21 is formed with a contact section 210 raised projecting out from the second side 21. (That is, the contact section 210 is formed on a surface of a projecting section of the second side 21 of the heat dissipation unit 2). A major surface of the contact section 210 has a slightly convex form. In this embodiment, the contact section 210 is, but not limited to, integrally formed with the heat dissipation unit 2 for illustration purposes. Alternatively, the contact section 210 and the heat dissipation unit 2 can be non-integrally formed according to the requirement of use. The contact section 210 and the heat dissipation unit 2 are made of a material selected from a group consisting of silver, copper, aluminum, iron and other high thermo-conductive material. The contact section 210 and the heat dissipation unit 2 can be made of the same material or different materials.

The die 3 has an upper surface 30 and a lower surface 31. The major surface of the contact section 210 attaches to and is in contact with the upper surface 30. The upper surface 30 has a slightly concave form in adaptation to the slightly convex form of the contact section 210. The lower surface 31 is correspondingly mounted on a substrate board 4.

Please further refer to FIG. 2. A micro-gap (not shown) is formed between the contact faces of the heat dissipation unit 2 and the die 3. A thermo-conductive coating 32 is correspondingly coated and disposed in the micro-gap. The thermo-conductive coating 32 is selected from a group consisting of thermal grease, thermal adhesive and thermal pad. The thermo-conductive coating 32 serves to more fully fill the micro-gap so as to avoid thermal resistance caused by the micro-gap.

According to the structural design of the present invention, when the die 3 starts to work, the die 3 will generate heat to make the temperature of the die 3 gradually rise. Due to the material of the die 3 itself and the manufacturing process of the die 3 and other factors, the die 3 will deform at high temperature. That is, the center of the upper surface 30 of the die 3 will deform gradually to present a slightly concave form. As aforesaid, one end of the contact section 210 of the heat dissipation unit 2 has a slightly convex form fully in adaptation to the slightly concave form of the upper surface 30 of the die 3. Therefore, at this time, the contact section 210 can fully contact and attach to the upper surface 30 of the die 3. In contrast, the conventional heat dissipation unit has a shortcoming that the contact face is a plane face, which can hardly fully contact and attach to the deformed concave upper surface of the die. As a result, a gap is formed between the contact faces to cause thermal resistance. The present invention effectively improves the thermal resistance problem of the conventional heat dissipation unit so that the heat of the die 3 can be quickly carried away by the heat dissipation unit 2 to greatly enhance the heat dissipation efficiency.

It should be noted that the deformation (slightly concave form) of the upper surface 30 of the die 3 is very small. The unit of the deformation amount of the upper surface 30 of the die 3 is generally in the order of μm. Therefore, the curvature of the deformation ranges from 50 μm to 70 μm. The deformation in the drawing is several-times enlarged for illustration purposes so as to more clearly understand the structural design of the present invention. The curvature of the slightly convex form of the contact section 210 of the heat dissipation unit 2 is also very small. In addition, the unit of the curvature is in the order of μm. Therefore, the second side 21 of the heat dissipation unit 2 is generally selectively processed by means of grinding to make the contact section 210 in a slightly convex form. However, the manufacturing method of the slightly convex form is not limited to grinding. Alternatively, the manufacturing method of the slightly convex form can be CNC processing, milling processing or other processing method.

In conclusion, in comparison with the conventional heat dissipation unit, the present invention has the following advantages:

1. The thermal resistance problem is greatly reduced.
2. The heat dissipation performance is greatly enhanced.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A die heat dissipation structure comprising:
   a heat dissipation unit having a first side and a second side, the second side being formed with a contact section, the overall contact section projecting away from the second side, an exposed face of the contact section having a slightly convex curvature, the overall slightly convex curvature disposed away from the exposed face; and
   a die having an upper surface and a lower surface, the exposed face of the contact section attaching to and being in contact with the upper surface, the upper surface having a slightly concave curvature in adaptation to the slightly convex curvature of the exposed face of the contact section and wherein the exposed curvature of the contact section and the slightly concave curvature of the upper surface of the die is at least 0.05 mm.

2. The die heat dissipation structure as claimed in claim 1, wherein a micro-gap is formed between the heat dissipation unit and the die, a thermo-conductive coating being coated and disposed in the micro-gap.

3. The die heat dissipation structure as claimed in claim 1, wherein the contact section and the heat dissipation unit are integrally formed or non-integrally formed.

4. The die heat dissipation structure as claimed in claim 1, wherein the curvature of the exposed face of the contact section and the slightly concave face of the upper surface of the die ranges from 0.05 mm to 0.07 mm.

5. The die heat dissipation structure as claimed in claim 1, wherein the heat dissipation unit is further formed with multiple radiating fins, the radiating fins being arranged on the first side at intervals.

6. The die heat dissipation structure as claimed in claim 1, wherein the lower surface of the die is correspondingly mounted on a substrate board.

7. The die heat dissipation structure as claimed in claim 1, wherein the contact section of the heat dissipation unit is processed by means of grinding, whereby one end of the contact section has said slightly convex face.

* * * * *